United States Patent [19]

Ohashi et al.

[11] Patent Number: 4,949,164
[45] Date of Patent: Aug. 14, 1990

[54] SEMICONDUCTOR COOLING APPARATUS AND COOLING METHOD THEREOF

[75] Inventors: Shigeo Ohashi, Chiyoda; Heikichi Kuwabara, Minori; Tadakatsu Nakajima, Chiyoda; Wataru Nakayama, Kashiwa; Motohiro Sato, Minori; Kenichi Kasai, Ushiku, all of Japan

[73] Assignee: Hitachi, Ltd., Tokyo, Japan

[21] Appl. No.: 216,704

[22] Filed: Jul. 7, 1988

[30] Foreign Application Priority Data

Jul. 10, 1987 [JP] Japan ................................. 62-172403

[51] Int. Cl.$^5$ ..................... H01L 23/02; H01L 25/04; H01L 23/16
[52] U.S. Cl. ........................................ 357/82; 357/75; 357/81; 165/80.4; 165/104.33; 361/385
[58] Field of Search ............ 357/82; 165/80.4, 104.33; 361/385

[56] References Cited

U.S. PATENT DOCUMENTS

| 3,741,292 | 6/1973 | Aakalu et al. | 165/105 |
| 4,050,507 | 9/1977 | Chu et al. | 165/1 |
| 4,182,412 | 1/1980 | Shum | 165/133 |
| 4,203,129 | 5/1980 | Oktay et al. | 357/82 |
| 4,381,818 | 5/1983 | Sachar et al. | 165/133 |
| 4,619,316 | 10/1986 | Nakayama et al. | 165/104.33 |
| 4,694,378 | 9/1987 | Nakayama et al. | 361/385 |

FOREIGN PATENT DOCUMENTS

| 0204156 | 12/1982 | Japan | 357/82 |
| 0240146 | 11/1985 | Japan | 357/82 |
| 0085448 | 4/1987 | Japan | 357/82 |

OTHER PUBLICATIONS

Hwang et al., "Subcooled Flow Boiling with Flow Pattern Control", IBM Tech. Disclosure Bulletin, vol. 22, No. 5, Oct. '79 (pp. 1843-1844).
Chu & Simons, "Thermal Card and Coding", IBM Tech. Dis. Bull., vol. 10, No. 10, Mar. 1968 (pp. 1559-1560).

Primary Examiner—Rolf Hille
Assistant Examiner—David M. Ostrowski
Attorney, Agent, or Firm—Antonelli, Terry, Stout & Kraus

[57] ABSTRACT

High heat generation member of electronic integrated circuit etc. is boiled and cooled. A refrigerant steam is generated by cooling of the heat generation member and is condensed by a condenser which is provided an upper portion. A refrigerant steam flow path and a condensed refrigerant flow path from the condenser are separated with a partition wall. The condensed liquid sent back to the partition wall is supplied to the heat generation member through the partition wall.

22 Claims, 8 Drawing Sheets

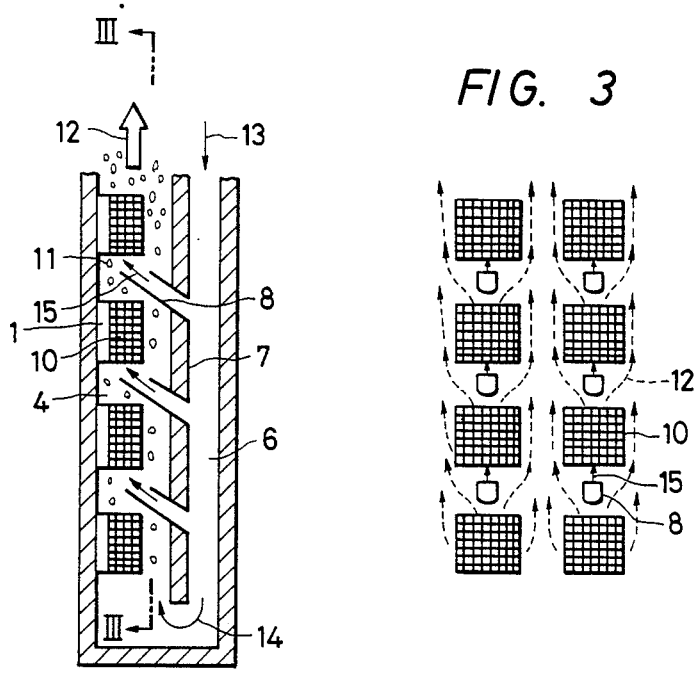
FIG. 2
FIG. 3
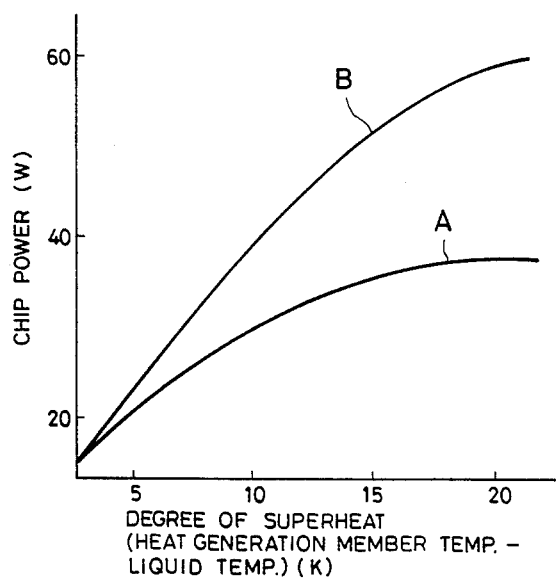
FIG. 4

FIG. 8
FIG. 9
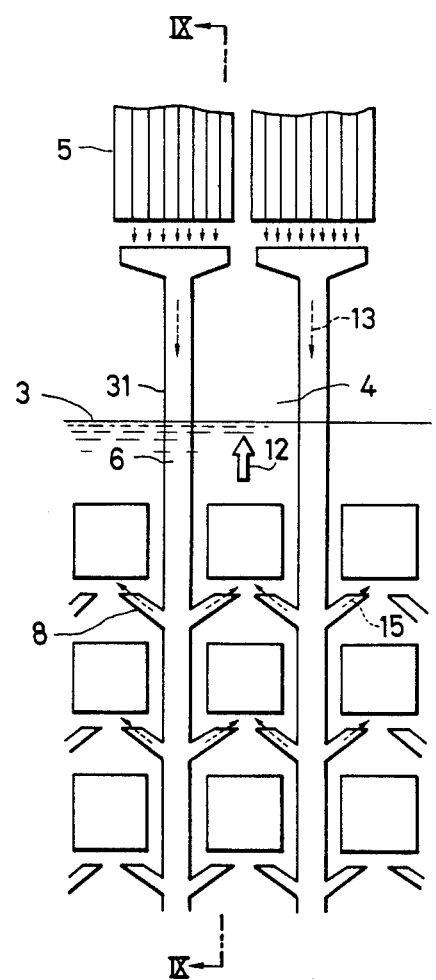
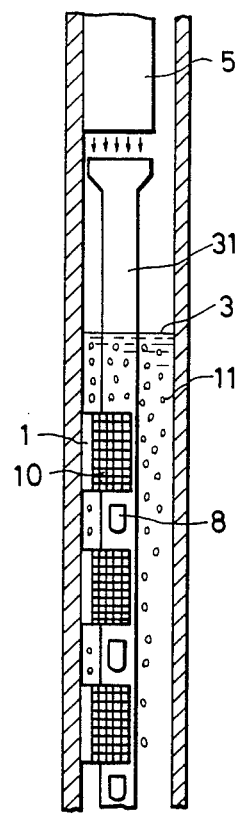

SEMICONDUCTOR COOLING APPARATUS AND COOLING METHOD THEREOF

BACKGROUND OF THE INVENTION

The present invention relates to a boiling/cooling apparatus of a large number of high heat generation members being arranged in high density inside a limited space such as integrated circuits for electronic computers, that is, to a semiconductor cooling apparatus.

In a conventional semiconductor cooling apparatus such as one disclosed in U.S. Pat. No. 3,741,292, a substrate on which chips are mounted is dipped within a refrigerant liquid enclosed into a container, boiling bubbles generated from the chips ascend and reach a steam reservoir at the upper portion and the steam is condensed by a cooling plate projecting into the container and is then returned to a liquid reservoir at the lower portion.

According to this method, however, the contact between the chips fitted to the upper portion and the refrigerant liquid drops due to the boiling bubbles that are built up from the below portion. Therefore, it has been necessary to increase the size of the container so that a greater amount of the refrigerant liquid can be supplied to the upper portion and the boiling bubbles can be scattered.

Another prior art example is described in Japanese Patent Laid-Open No. 204156/1982. In this prior art apparatus, a heat generation member is dipped into a refrigerant liquid, the boiling steam is condensed and liquefied by a condenser disposed at the upper portion of the container and guide plates disposed between the heat generation member and the condenser permit the circulation of the boiling steam and the condensate liquid without mutual interference.

However, this method involves the problem in that when the exothermic quantity of the heat generation member is great, the heat generation portion becomes an ascending gas-liquid current as a whole due to vigorous boiling at the heat generation portion and the liquid that has been condensed and drops cannot be supplied sufficiently to the heat generation member. Accordingly, the cooling performance in this prior art apparatus drops.

The above stated prior art examples do not consider the method of bringing the entire heat generation portion into contact with the refrigerant liquid and invite the drop of cooling performance. Even if they consider such a method, the container becomes greater in size in order to secure sufficient contact In a cooling structure wherein a large number of substrates on which high exothermic chips such as chips for computers are mounted and laminated, the wiring distance between the substrates gets elongated and a higher calculation speed cannot be accomplished smoothly.

Further, another prior art example is described in Japanese Patent Laid-Open No. 85448/1987. In this prior art apparatus, an apparatus in which a plurality of LSI's are mounted on a vertically disposed substrate is dipped into the refrigerant liquid, LSI apparatus is boiling-cooled, due to the insertion of the heat exchanger pipe into the refrigerant liquid, thereby the cooling performance is improved.

In the former above stated prior art example, when non-condensable gas leaks into the refrigerant liquid, the cooling performance is lowered remarkably, besides in this Japanese Patent Laid-Open No. 85448/1987, since the heat exchanger pipe is inserted into the refrigerant liquid, even though the non-condensable gas leaks into the refrigerant liquid container, it is possible to maintain the cooling performance at a predetermined value.

However, the cooling performance value itself is lower than that of the above stated prior art example in which the heat exchanger pipe is inserted into the refrigerant steam being, the refrigerant steam generated by boiling at LSI portion is concentrated at the heat exchanger pipe portion, thereby the cooling performance is improved.

However, in recent years the exothermic quantity per unit LSI chip has increased and further the interval between adjacent LSI chips tends to narrower comparatively, accordingly the steam amount per unit volume has increased.

At the apparatus in which the heat exchanger pipe is inserted into the refrigerant liquid, the refrigerant steam is concentrated at the heat exchanger pipe portion. However, in the high integration semiconductor elements the steam amount increases, then the refrigerant steam is accumulated and this refrigerant steam covers around the LSI chips, therefore there is problem that the boiling performance of the LSI chip becomes lower.

SUMMARY OF THE INVENTION

It is therefore an object of the present invention to obtain a semiconductor cooling apparatus having high cooling performance and a cooling method thereof wherein the refrigerant liquid is circulated naturally and efficiently without increasing unnecessarily its quantity and can be supplied substantially uniformly throughout the entire heat generation portion.

Another object of the present invention is to obtain a high cooling performance wherein a part of the generated steam amount is condensed in the refrigerant liquid, the remainder escapes toward the upper portion and condensed at the upper refrigerant steam layer portion, the refrigerant liquid being subcooled more than the saturated temperature is introduced to the respective LSI chip portion.

So as to attain above stated objects, in the present invention, in a semiconductor cooling apparatus wherein a container having enclosed a refrigerant liquid therein, a substrate having mounted a plurality of semiconductor elements thereon and dipped in the refrigerant liquid of the container, a heat of the semiconductor elements is absorbed by boiling of the refrigerant liquid and a resulting steam is condensed by a condenser disposed at an upper portion of the container and sent back to a lower portion of the container, in the present invention a flow path of the steam and a flow path of the condensate liquid is separated from one another by a partition wall, and a flow path is provided for supplying the condensate liquid sent back to the partition wall to each of the heat transfer members for promoting boiling and includes back-flow prevention means.

Another feature of the present invention resides in that porous structure type heat transfer members for promoting boiling are mounted on a rear surface side (anti substrate side), liquid coolers are provided in a refrigerant liquid in which a refrigerant steam generated at the heat transfer members passes, and the refrigerant steam passes in the liquid cooler, thereby a part of the refrigerant steam is condensed, remainder of the refrigerant steam is condensed by a condenser provided at an upper refrigerant steam layer portion and sent back to a lower portion of a container, and this send-back condensate is supplied to the respective heat transfer member for promoting boiling through the liquid cooler provided in the refrigerant liquid.

Still another feature of the present invention resides in that a cooling method for semiconductor elements comprising steps of, mounting a number of heat generation members on a substrate, dipping the heat generation member into a refrigerant liquid in such a manner that the substrate being held at a substantially vertical state, preparing a partition wall structure member at an anti substrate side of the heat generation member, condensing a refrigerant steam generated by cooling the heat generation member at a steam layer portion of the refrigerant liquid in such a manner that the generated refrigerant steam is ascent between the substrate and the partition wall structure member, descending the resulting condensed refrigerant liquid by passing a flow path formed at an anti substrate side of the partition wall structure member, and supplying the descending condensed refrigerant liquid to the heat generation member portion through passing the flow path formed at the partition wall structure member.

Other features, objects and merits of the present invention will be made clear by following explanation referring to the attached drawings

BRIEF DESCRIPTION OF THE DRAWINGS

FIG. 2 is a cross-sectional view of the principal portions of FIG. 1;

FIG. 3 is a cross-sectional view taken along a line III—III of FIG. 2;

FIG. 4 is an explanatory view useful for explaining the effect of the present invention;

FIG. 8 is a front view of the principal portions of still another embodiment;

FIG. 9 is a cross-sectional view taken along a line IX—IX of FIG. 8;

DESCRIPTION OF THE INVENTION

Figure 1:
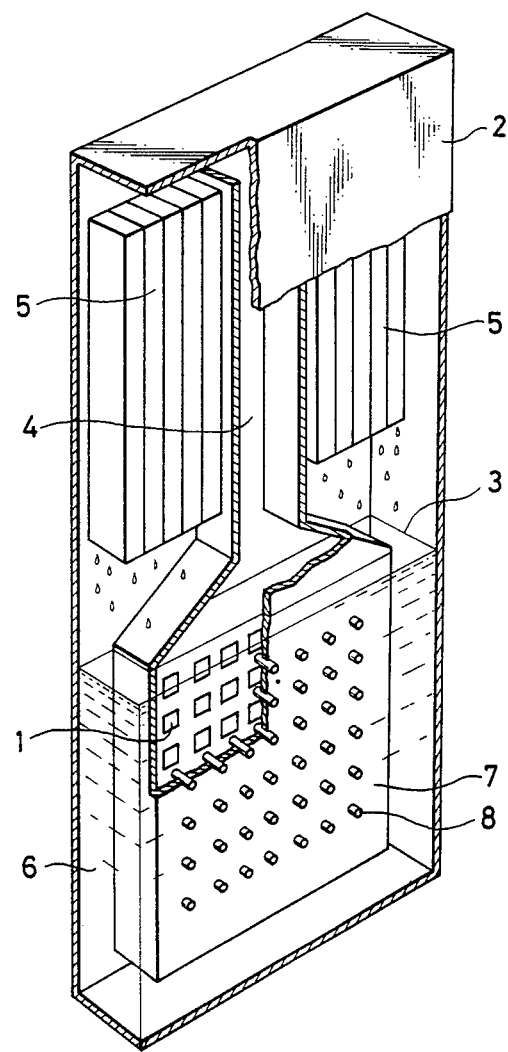
FIG. 1 is a partially cut-away perspective view of a semiconductor cooling apparatus in accordance with the present invention.

The refrigerant liquid changes its phase from the liquid phase to the gaseous phase by the heat generated by the heat generation members such as integrated circuit chips. The resulting steam bubbles and ascends and the heat generation portion forms an ascending current as a whole. On the other hand, the refrigerant liquid condensed and liquefied by a condenser above the heat generation portion becomes a descending current at the heat generation portion. The liquid must be supplied sufficiently to the heat generation portion so that boiling takes place efficiently.

Accordingly, in the present invention, in order to prevent mutual interference between the ascending gas-liquid flow path at the heat generation portion and the descending liquid flow path that has been condensed and liquefied, so as to separate both flow paths from one another and to return the refrigerant liquid to the heat generation portion.

For example, so as to separate both flow paths, the disposition of a partition wall alone separates so that the refrigerant liquid to the boiling portion is supplied only to the lowermost portion of the heat generation member which is at the lower end of the partition wall.

According to this arrangement, the contact with the refrigerant liquid decreases progressively with the upper portion because the steam is built up and ascends from below to the upper portion of the heat generation portion.

Therefore, a plurality of flow paths capable of permitting the inflow of the refrigerant liquid into the heat generation portion while preventing the steam from flowing back towards the liquid side and hindering the liquid flow are disposed on the partition wall, so that the refrigerant liquid can be supplied directly to the heat generation portion not only to the lowermost portion of the partition wall but also from the intermediate portions of the descending liquid flow paths.

Accordingly to this arrangement, the refrigerant liquid can be supplied sufficiently to the entire heat generation portion and the heat generation portion can be cooled efficiently even when high heat is generated.

Hereinbelow, specific embodiments of the present invention will be explained in detail referring to the drawing.

FIG. 1 shows one embodiment of the present invention. In this figure, a large number of integrated circuit chips / arranged on a wiring substrate are disposed at a lower portion inside a flat container 2. A refrigerant liquid 3 such as $C_6F_{14}$ is enclosed into the container 2 and the chips 1 are dipped completely.

The refrigerant liquid 3 is boiled by exothermicity of the chips 1 and is converted to steam bubbles, which pass through a steam flow path 4 and flow into a condensation portion at an upper portion of the container 2. A heat transfer member for promoting boiling is fitted to each chip 1.

The condensation portion is equipped with a condenser 5 and the steam makes heat-exchange with water flowing inside the condenser 5 the stream, is condensed and, drops due to the gravitational force and returns to the lower heat generation portion through a liquid flow path 6 or a condensate path 6.

The steam flow path 4 and the condensate flow path 6 are separated from each other by a partition wall 7. Since the bubbles of steam generated by exothermicity of the chips 1 move upward, the heat generation portion becomes an ascending current as a whole.

On the other hand, the refrigerant liquid liquefied by the condenser 5 becomes a descending current due to the gravitational drop, but since the steam flow path 4 and the condensate flow path 6 are separated from each other, the refrigerant liquid can be circulated smoothly without mutual interference between them.

The refrigerant liquid 3 that has descended and returned to the heat generation portion is supplied once again around the chips 1 and removes their heat. Pipes 8 are disposed as guide flow path (guide members) on the partition wall 7 that separates the steam flow path 4 and the condensate flow path 6 from each other so that the refrigerant liquid 3 can be supplied to each chip 1 throughout the entire heat generation portion through each pipe 8.

The operation of the present invention will now be explained with reference to FIG. 2. In order to remove efficiently the heat from a large number of chips 1 that are arranged, boiling must develop efficiently at the heat transfer members 10 for promoting boiling that are fitted to the chips 1.

When boiling generates from only the surface of the chips 1, the heat removal limitation exists due to the nucleus boiling, therefore so much heat can not removed. The heat is removed the degree of $20W/cm^2$ at the utmost, and when heat more than this value is tried to transfer to the refrigerant liquid 3 side, the temperature at the chip 1 side rises abruptly.

Since the porous structure type heat transfer members 10 are provided at the chip rear side, there is multiplied not only an effect by increase of the heat transfer area but also together the generation of the bubbles from the heat transfer surface, namely an effect by rapid increase of the bubble generation nucleus, thereby the boiling performance is improved, the heat having the degree of $100W/cm^2$ is removed and the generated refrigerant steam amount is increased widely.

In other words, the heat transfer members 10 must be covered with, and be prevented from drying, by the steam bubbles 11 generated by boiling. To accomplish this object, it is necessary that the resulting steam leaves rapidly the heat transfer member 10 and the circulation of gas-liquid is effected smoothly inside the container so that the refrigerant liquid 3 can be supplied to the heat transfer member 10.

Let's consider the gas-liquid flow. At the heat generation portion, the steam develops from all the chips 1 and ascend as the steam bubbles 11 so that the vigorous ascending current 12 occurs as a whole while the liquid that has been condensed and liquefied and returns to the heat generation portion becomes the descending current 13.

In order to insure a smooth gas-liquid flow, therefore, mutual interference of the ascending current 12 and the descending current 13 must be prevented. This can be accomplished by separating each flow path by the partition wall 7.

At the chips 1 arranged at upper the portion, however, the ascending steam bubbles 11 from below are built up. Accordingly, the chips 1 and the heat transfer members 10 at the upper position are more likely to be covered by the steam bubbles 11 and dried by them.

Since, only the provision of the partition wall 7, the refrigerant liquid 3 flows only from the lowermost portion 14 of the partition wall 7, as the refrigerant liquid 3 is not supplied enough to the chips 1 arranged at the upper portion the cooling performance might drop remarkably.

Therefore, in this embodiment, the pipes 8 are disposed on the partition wall 7 so as to correspond to the chips 1, respectively, and to permit the inflow 15 of the refrigerant liquid 3 to the heat transfer members 10 at the upper portion.

In this instance, the velocity of the ascending gas-liquid flow is by far greater than that of the descending liquid flow and the refrigerant liquid 3 is sucked towards the steam flow path 4 due to a pressure difference.

The higher the position, the higher becomes the gas-liquid flow velocity so that the higher the portion, where drying is more likely to occur, the refrigerant liquid 3 is absorbed largely via the pipe 8. In this manner, the refrigerant liquid 3 can be supplied efficiently throughout the respective entire heat generation portion.

The pipes 8 extend obliquely upward towards the heat transfer members 10, therefore, the steam bubbles 11 does not cause flow towards the condensate flow path 6 and the inflow 15 of the refrigerant liquid is not prevented, either. In this embodiment, the oblique structure of the pipes 8 constitutes back-flow prevention means of the refrigerant liquid towards the condensate flow path 6.

Since each pipe 8 is long enough to reach the root of the heat transfer member 10, the refrigerant liquid can be supplied to the root of each heat transfer member 10 where the temperature is high and drying is more likely to occur.

Furthermore, the pipe 8 has a function so as cut off the ascending current 12 from the below and makes it more difficult for the steam bubbles 11 from the lower portion to cover the heat transfer member 10, as shown in FIG. 3.

Therefore, even if all the chips 1 exhibit a very high exothermic quantity, boiling takes place efficiently and high cooling performance can be obtained.

It can exhibit heat transfer performance in accordance with the exothermic quantity of the integrated circuit chips 1 by changing the diameter and number of pipes 8 and even when the chips 1 having different exothermic quantities exist mixed, the temperature of the chips 1 can be kept uniform.

FIG. 4 shows the effect of this embodiment. Curve A represents a comparative result when eighty one piece of heat generation members are cooled inside the flat container without using the partition wall 7.

Curve B represents the result of the embodiment of the present invention wherein the gap between the heat generation members and the partition wall 7 is set to be equal to the gap between the heat generation members and the container wall in front of them when the partition wall 7 is not used, and the pipes 8 are disposed on the partition wall 7. It can be seen from the diagram that the performance can be improved drastically.

Figure 5:
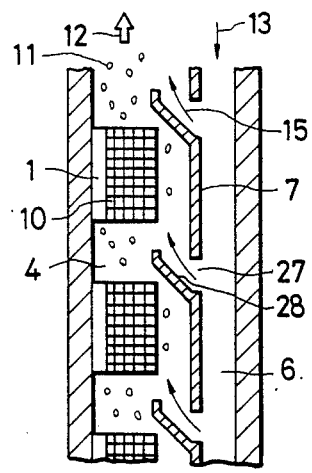
FIGS. 5 and 6 are cross-sectional view and front view of the principal portions of different embodiments, respectively.

FIG. 5 shows another embodiment differed from the embodiment shown in FIG. 2. In this embodiment, openings 27 for the inflow of the liquid are bored on the partition wall 7 and pawl-like members 28 for preventing the back-flow of the steam bubbles 11 towards the descending liquid flow 13 are disposed on the partition wall 7 as back-flow prevention means.

The guide member (guide flow path) is constituted by these members 27 and 28, the inflow 15 of the refrigerant liquid 3 is not prevented by the back-flow of the steam bubbles 11 towards the descending path and the heat transfer members 10 even when a large number of integrated circuit chips 1 are mounted, and high cooling efficiency can be therefore obtained.

Figure 6:
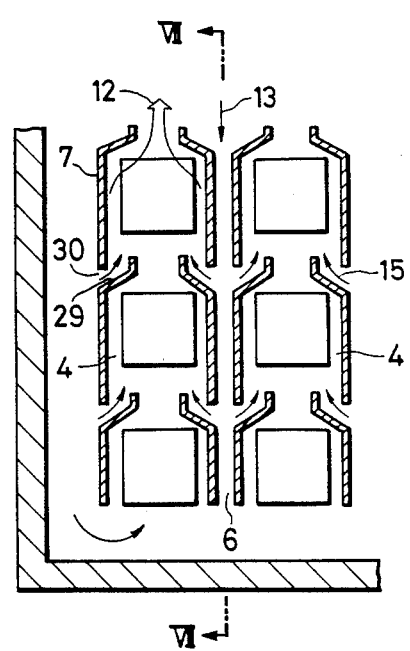
Figure 7:
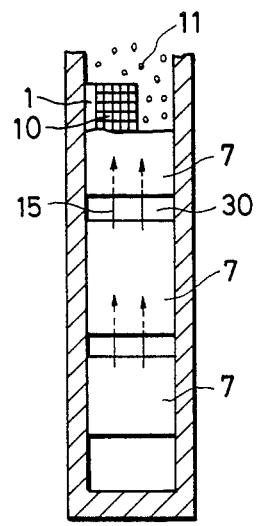
FIG. 7 is a cross-sectional view taken along a line VII—VII of FIG. 6.

FIG. 6 shows still another embodiment. This embodiment is suitable when a ultra-thin structure is required for the cooling apparatus.

If the heat transfer members 10 are fitted to the chips 1 even though the thickness of the cooling structure must be reduced, the space for the refrigerant flow path 6 to be disposed on the front surface of the heat transfer members 10 becomes extremely small and the partition wall 7 is therefore disposed sideways of the heat transfer members 10.

The steam bubbles 11 generated from the heat generation member move also sideways so that the side portions of the heat generation members are separated into each flow path 4 and 6 of the ascending flow 12 and the descending flow 13 by the partition wall 7.

Gaps 30 are defined on the partition wall 7 and the pawl-like members 29 for preventing the back-flow of the resulting steam bubbles 11 towards the condensate flow path 6 are disposed on the partition wall 7 as the back-flow prevention means.

Accordingly, the refrigerant liquid 3 can be supplied smoothly to all the heat transfer members without being prevented by the back-flow of the steam bubbles 11.

Furthermore, the performance of the heat transfer members 10 can be controlled by changing the size of the gaps 30 and the angle of the pawl-like members 29 to the partition wall 7 in accordance with the exothermic quantity of the integrated circuit chips 1.

For this reason, boiling takes place efficiently on all the heat transfer members 10 and it is thus possible not only to obtain high cooling performance but also to reduce the thickness of the cooling structure. Accordingly, the packaging density of the integrated circuit chips 1 can be improved.

FIG. 8 shows still another embodiment differed from the embodiment shown in FIG. 6. In this embodiment, a plurality of tubular partition walls 31 are disposed on the side portions of the heat transfer members 10 so as to separate the descending flow 13 and the ascending flow 12 from one another.

Liquid supply pipes 8 are fitted to each tubular partition wall 31 obliquely upward relative to the heat transfer members 10 in order to prevent the back flow of the bubbles 11. This oblique structure constitutes the back-flow prevention means.

The liquid condensed by the condenser 5 disposed at the upper portion of the container 2 is returned to each heat generation portion through the expanded portion of the tubular partition wall 31 immediately before the condenser 5. The descending liquid is supplied to all the heat transfer members 10 through each pipe 8 without being hindered by the steam bubbles 11 that are generated at each heat transfer member 10.

Accordingly, boiling of the refrigerant liquid 3, evaporation, condensation, return of the liquid and the supply of the liquid to the heat transfer members 10 can be carried out smoothly. It becomes thus possible not only to obtain high cooling performance but also to reduce the thickness of the cooling structure and to make it more compact, as shown in FIG. 9.

Figure 10:
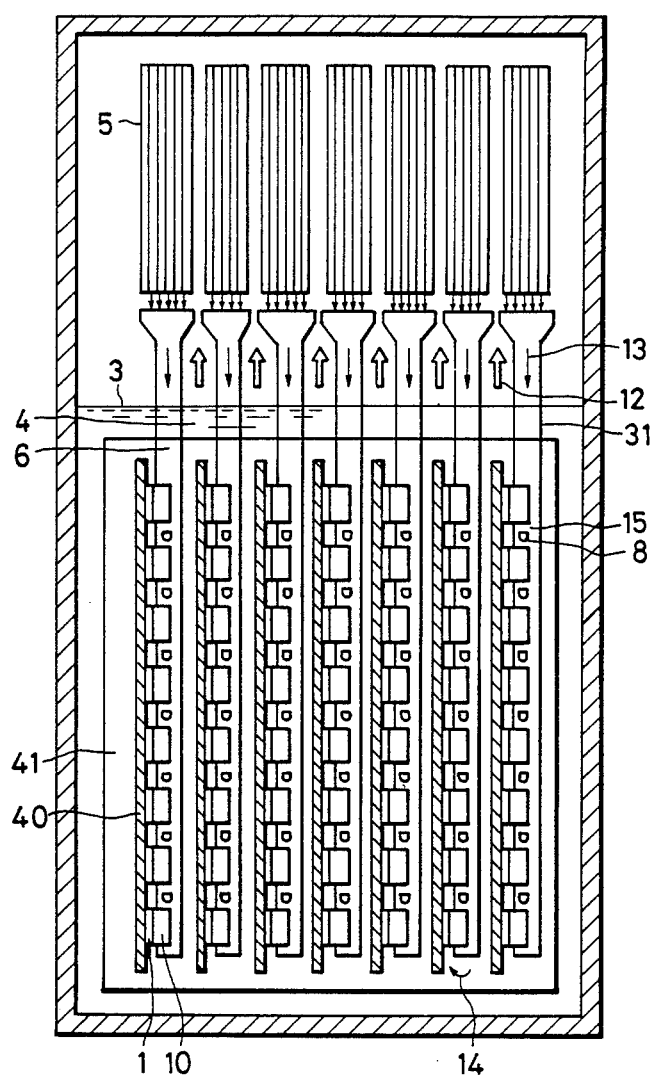
FIG. 10 is a front view of still another embodiment.

FIG. 10 shows still another embodiment. In this embodiment, a plurality of wiring substrates 40 to which the integrated circuit chips 1 having fitted thereto the heat transfer members 10 are mounted are fitted to a back board 41 and are dipped into the refrigerant liquid 3. The condenser 5 is mounted to the upper portion of the container 2. The gap between the adjacent wiring substrates 40 is minimized in order to improve packaging density of the integrated circuit chips 1.

In this case, the refrigerant flow paths around the heat transfer members 10 become narrow so that the cooling performance of the heat transfer members 10 will drop remarkably by the supply of the refrigerant liquid from the lowermost portion 14 of the wiring substrates 40.

Therefore, the tubular partition walls 31 equipped with the pipes 8 that extend obliquely upward towards the heat transfer members 10 (which oblique pipes 8 constitute the back-flow prevention means) are disposed in the gaps defined between the heat transfer members 10 and between the heat transfer members 10 and the wiring substrates 40 so as to separate the steam flow path 4 and the condensate flow path 6 from one another.

According to this arrangement, the ascending flow 12 and the descending flow 13 do not interfere with each other and the gas-liquid circulation can be effected efficiently for all the wiring substrates 40. Moreover, the refrigerant liquid can be supplied through the pipes 8 not only to the heat transfer members 10 from the lower portion 14 of the substrates but also to those at the upper portion without being hindered by large quantities of the bubbles 11.

Therefore, high cooling performance can be obtained under the high density packaging state. Incidentally, the flow path structure shown in FIGS. 2, 5 and 6 can be used in place of the tubular partition walls 31.

Figure 11:
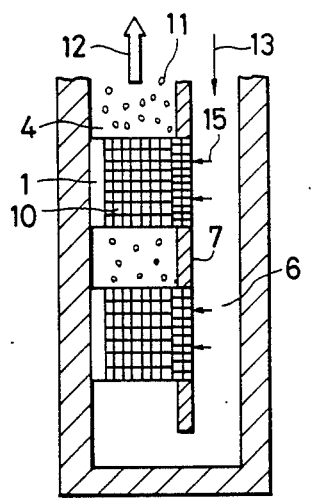
FIGS. 11 and 12 are cross-sectional views of other different embodiments, respectively.

FIG. 11 shows still another embodiment. In this embodiment, the heat transfer members 10 for promoting boiling having a porous structure which is equipped with through-holes in both longitudinal and transverse directions are fitted to the integrated circuit chips 1 and the flow paths are separated to the ascending flow 12 and the descending flow 13 by the partition wall 7.

Each heat transfer member 10 penetrates through the partition wall 7 and its front surface faces the condensate liquid flow path 6. Accordingly, the refrigerant liquid can enter directly the heat transfer member 10 due to the surface tension resulting from capillarity without being hindered by the steam bubbles 11.

Incidentally, in order to prevent the steam generated inside the heat transfer members 10 from flowing out towards the condensate flow path 6, on the contrary, the pore diameters of the through-pores at the tip facing the condensate flow path 6 may be made smaller than those at the other portions so as to reduce the porosity. In this manner, the back-flow prevention means can be formed.

Therefore, boiling, condensation, the return of the liquid to the heat generation portion and the supply of the liquid to the heat transfer members 10 can be carried out efficiently and high cooling performance can be obtained. If the through-holes in the transverse direction are disposed not horizontally but obliquely upward, by this oblique structure the back-flow prevention means can be made surely all the more.

Figure 12:
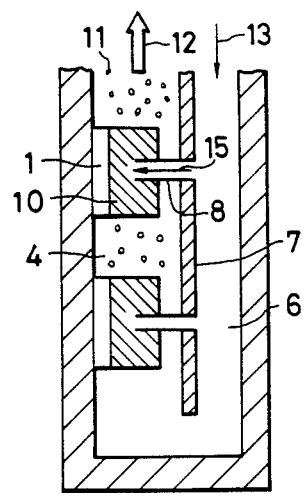

FIG. 12 shows still another embodiment. In this embodiment, the heat transfer members 10 for promoting boiling having a porous structure equipped with through-holes in both longitudinal and transverse directions are fitted to the integrated circuit chips 1, and the pipes 8 reaching directly the interior of the heat transfer members 10 are disposed on the partition wall 7.

The flow path is divided into the ascending flow path 12 and the descending flow path 13 by the partition wall 7 and the refrigerant liquid is supplied to the heat transfer members 10 through the pipes 8 disposed on the partition wall 7. Accordingly, the refrigerant liquid is supplied efficiently to each heat transfer member 10 without being affected adversely by the steam bubbles 11.

The refrigerant liquid is sucked into the through-holes of each heat transfer member 10 due to the pressure difference. Since the refrigerant liquid is supplied directly into the interior of the through-holes of the heat transfer member 10 which is likely to dried at this time, the effect of the liquid supply for the improvement in boiling/heat transfer performance of the heat transfer member 10 is extremely great. Therefore, an excellent cooling performance can be obtained for the heat transfer members 10 fitted to all the integrated circuit chips 1.

In accordance with the above stated embodiment, the ascending flow path 12 of the bubbles 11 and the descending flow path 13 of the condensate are separated by the partition wall 7 and the condensate sent back from the flow path equipped with the back-flow prevention means, that is, the refrigerant liquid, is supplied to each of the heat transfer member 10.

Accordingly, the circulation of the gas-liquid flow inside the container 2 can be effected smoothly and the refrigerant liquid can be supplied to the portions where the contact with the refrigerant liquid drops due to the steam bubbles 11. In this manner, this embodiment can be obtain a semiconductor cooling apparatus which is small in size but has high cooling performance.

Further another embodiment of the present invention apparatus will be explained referring to FIG. 13 through FIG. 18.

First all, it will be explained referring to FIGS. 13 and 14. A number of chips 1 are mounted on a surface of a substrate 40, and a number of semiconductor elements are inserted inside on each chip 1. A wiring on the substrate 40 and the semiconductor elements on the chip 1 are connected electrically.

When the semiconductor element is "on" condition, the signal is exchanged and the semiconductor element on the chips 1 generates heat. As a power feeding system 50 for feeding an electric input to the substrate 40 and the chips 1 generates a heat, it is necessary to cool also the power feeding system 50. In the present invention, the chips 1 and the power feeding system 50 are dipped together into a refrigerant liquid 3 and cooled by boiling thereof.

At the rear side (the opposite side of the substrate 40) of the chips 1, porous structure type heat transfer members 10 for promoting boiling are provided so as to improve the boiling performance. At the tip side of the heat transfer members 10, liquid coolers 51 are disposed in opposite to the tip thereof with a gap, and a condenser 5 is disposed at the respective upper portion of the substrate 40, the chips 1 and the liquid coolers 51.

The substrate 40, the chips 1, the power feeding system 50, the liquid coolers 51 and the condenser 5 are inserted respectively in a chamber (container) 52, and the refrigerant liquid 3 having a low boiling point is enclosed in the chamber 52. The refrigerant liquid 3 is enclosed so as to exist the level thereof between the liquid coolers 51 and the condenser 5 as shown in FIG. 14.

The wiring for exchanging signals and feeding to the power feeding system 50 and the substrate 40 from outside of the chamber 52 is made, for example utilizing the hermetic sealing mechanism etc.. The mechanism is to be set, for example, at a sealing plate 53 provided at the back side of the power feeding system 50.

One sheet of sealing plate 53 may adopt, however so the pressure of the refrigerant liquid 3 in the chamber 52 fluctuates, a plurality of sheets sealing plates 53 may adopt and divide to be a size in small as much as possible, thereby it can afford to bear the pressure. A sealing plate fixing frame 54 is fixed the chamber 52 via an O-ring 55.

If the chamber 52 receive a negative pressure (less than atmosphere pressure), then air etc. enters into the chamber 52, thereby there is danger that the condensate performance of the condenser 5 becomes lower.

Accordingly, the sealing plate fixing frame 54 is disposed at the outside position against the chamber 52, and the mechanism adopts so as to seal utilizing the O-ring 55. By the adoption of this mechanism, when the chamber 52 receives the negative pressure, the sealing plate fixing frame 54 is pushed into the chamber 52, thereby it is possible to prevent air etc. from entering thereinto.

The disposition extent of the power feeding system 50, the substrate 40 and the chips 1 is formed in such a manner that size is decided by following operation, namely during maintenance when in company with the sealing plate fixing frame 54 is removed from the chamber 52, then the power feeding system 50 and the chips 1 are taken out from the chamber 52 outside.

Next, the structures of the liquid coolers 51 and the condenser 5 will be explained. The liquid cooler 51 is constituted a metallic pipe 56 such as copper, aluminum etc. being mounted metallic fins 57 as aluminum etc. by soldering etc..

The cooling fluid from introduced a chiller flows into the pipe 56. The pipe 56 is disposed substantially horizontally in parallel with the substrate 40 and the fins 57 which are disposed substantially orthogonally with the pipe 56. The fins 57 are disposed inclined with the substrate 40 in which the upper portion side thereof is close to by the chip 1 and the lower portion side thereof goes off from the chip 1.

Besides, in the fin group of each row of the horizontal direction, the fins 57 are constituted so as to be roughly at the upper portion side closing to by the chip 1 and to be densely at the lower portion side going off from the chip 1. In this embodiment, as shown in figure, each fin group at the lower portion side is provided with two times density more than that of at the upper portion side.

The condenser 5 is constituted with a metallic pipe 58 having a metallic fin 59 by soldering.

Next, the operation principle will be explained. The semiconductor element is to be "on" condition, and when the chips 1 present exothermic state, as the refrigerant liquid 3 is a liquid having a low boiling point, the refrigerant liquid 3 starts boiling and removes the heat of the chips 1.

Figure 15:
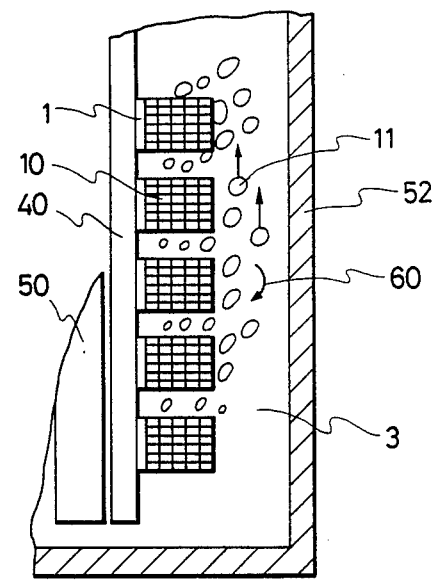
FIG. 15 is a cross-sectional view of the principal portions for explaining the motion of the generated refrigerant steam in absence of the liquid cooler.
Figure 16:
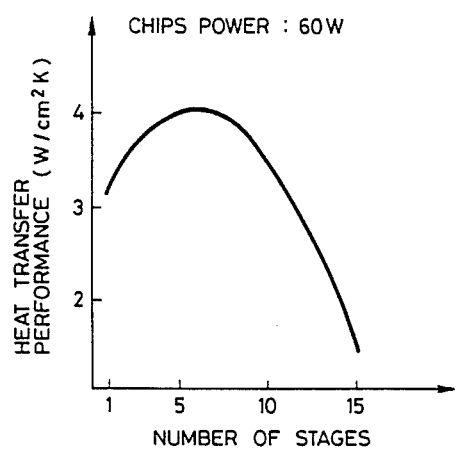
FIG. 16 is a diagram showing the distribution state of the heat transfer performance of the apparatus in FIG. 15.

The boiling performance when a number of the porous structure type heat transfer members 10 are mounted on the substrate 40 will be explained referring to FIGS. 15 and 16, in which no liquid cooler 51 is installed.

It will be observed with respect to each chip 1 from the lower portion side, in proportion to the higher chip arrangement being positioned to be upper portion side from the lowest stage, the second stage and the third stage, etc., the heat transfer performance is improved due to the liquid stirring effect (an arrow mark 60) of the ascending steam bubbles 11 generated from the lower chip portion.

However at more upper stage, the steam content amount in the refrigerant liquid 3 increases, the surrounding portion of the heat transfer members 10 is covered by the refrigerant steam. In this state the boiling performance lowers, accordingly the semiconductor element temperature in the chip 1 rises and exceeds a tolerance value. The heat transfer performance distribution state at the apparatus of FIG. 15 is shown in FIG. 16.

Figure 17:
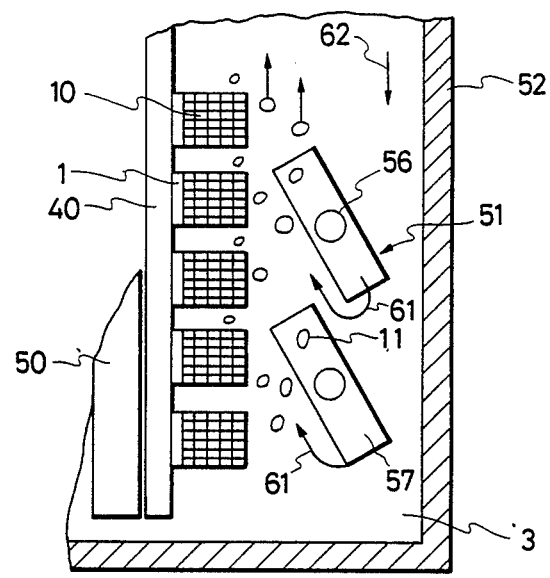
FIG. 17 is a cross-sectional view of the principal portions for explaining the motion of the generated refrigerant steam of the embodiment in FIG. 13.
Figure 18:
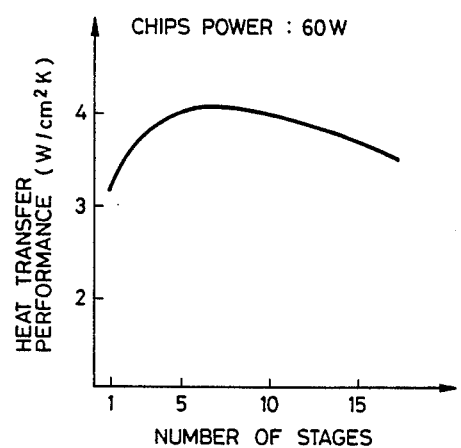
FIG. 18 is a diagram showing the distribution states of the heat transfer performance of the embodiments in FIGS. 13 and 17.

Next, a case in which the liquid coolers 51 are installed will be explained referring to FIGS. 17 and 18. When the steam bubbles generated from the lower stage chip 1 are accumulated and becomes increase, the steam rises between the liquid cooler 51 and the fins 57. In the pipe 56, the fluid having a lower temperature than that of the refrigerant liquid 3 flows, so that the pipe 56 and the fins 57 of the liquid cooler 51 becomes at a lower temperature than that of the refrigerant liquid 3.

Accordingly, the refrigerant steam (steam bubbles 11) ascending between the fins 57 is condensed, the steam content amount of the refrigerant liquid itself is not very so increased. Further, the pipe 56 and the fins 57 do not only condense the refrigerant steam 11 but also cool the refrigerant liquid 3.

According to introduction of this cool refrigerant liquid 3 into the surrounding portion of the porous structure type heat transfer members 10, it is possible to condense the refrigerant steam 11 surrounding the heat transfer members 10.

Figure 13:
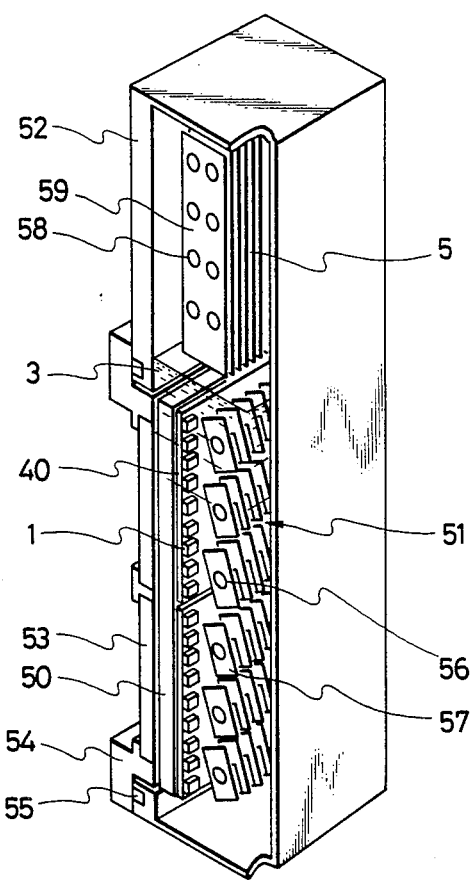
FIG. 13 is a partially cut-away perspective view according to further another embodiment of the present invention.
Figure 14:
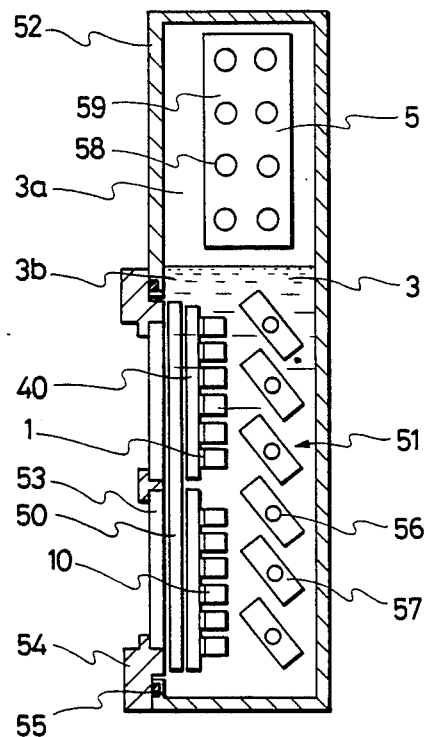
FIG. 14 is a cross-sectional side view of the embodiment of FIG. 13.

In this present invention, the liquid cooler 51 is separated a plurality of stages at up and down direction (an example shown in FIGS. 13 and 14, six stages). Each stage fin group is disposed so as to arrange roughly at the upper portion side closing to the chip 1 and to arrange densely at the lower portion side going off from the chip 1, accordingly the ascending refrigerant steam 11 flows into the rough portion (a large flow path area) of the fins as shown in FIG. 17.

Besides, the refrigerant liquid 3 flows into the dense portion (a small flow path area) of the lower portion side of each fin group by so-called pumping operation of the above stated ascending bubble 11 and is introduced into the porous structure type heat transfer member 10 side. The cool refrigerant liquid 3 being introduced the surrounding portion of the heat transfer members 10 has an effect that the boiling performance of the heat transfer members 10 can be improved all the more.

The refrigerant steam being not condensed by each stage fin group is introduced in more upper stage fin group and is subjected to condense. The refrigerant steam being not condensed by the liquid cooler 51 is introduced into a refrigerant steam layer portion 3a provided at the upper portion of the chamber 52 and then is condensed by the condenser 5.

The refrigerant being condensed and liquefied by the condenser 5 falls down due to the gravitational drop and is introduced again into a lower portion refrigerant layer portion 3b. This liquid falls down the fin roughly arranged side of the liquid cooler 51 as shown an arrow mark 62 and flows after into the heat transfer member 10 side through between the fins 57 as shown an arrow mark 61.

As stated above, the liquid cooler 51 works as a partition wall in which the ascending flow path of the generated steam bubbles 11 and the decending flow path of the condensed liquid refrigerant 3 are separated and controlled the respective flow path. The liquid cooler 51 having a partition wall function cools moreover the condensed liquid refrigerant 3 and introduces it into the heat transfer member 10 and alike has an operation as a guide member (a guide flow path) having a back-flow prevention function of the refrigerant liquid 3.

The boiling performance of the above stated embodiment will be explained referring to FIG. 18. According to this embodiment, even though at the upper stage portion of the chip 1, as the content amount of the steam bubbles in the refrigerant liquid 3 is suppressed at a low value, thereby high heat transfer performance can be maintained.

Further, according to high integration of the semiconductor elements, the exothermic amount of the power feeding system 50 increases, in this embodiment, since the power feeding system 50 is inserted into the chamber 52 and touches the refrigerant liquid 3, and the refrigerant liquid 3 boils from the surface of the power feeding system 50, thereby the power feeding system 50 can be cooled.

The refrigerant steam 11 generated at this portion rises and is condensed and liquefied at the condenser 5 positioned at the upper portion of the chamber 52 and returns again into the lower portion refrigerant liquid layer portion 3b. Further, in case of the exothermic amount in the substrate 40 is much, the substrate 40 can be cooled similar to in the case of the power feeding system.

According to this embodiment, as the generated steam bubbles 11 are condensed due to the liquid cooler 51, the steam content amount in the refrigerant liquid 3 at the upper portion of the integrated circuit chip group can be held down at a small value and also the refrigerant liquid 3 is cooled, and the resulting cool refrigerant liquid is introduced effectively into the surrounding portion of the porous structure type heat transfer members 10 being mounted on the rear surface of the chip 1, accordingly the cooling performance by boiling can be improved.

Further, the liquid cooler 51 of this embodiment has a structure in which the fins 57 are furnished with the pipe 56, as the refrigerant steam 11 and the refrigerant liquid 3 flow into between the fins 57, a large heat transfer performance is obtained, thereby the condensation performance of the refrigerant steam 11 and the cooling performance of the refrigerant liquid 3 are improved. According to the substantially vertically disposed fin plate structure, the refrigerant steam 11 and the refrigerant liquid 3 can be flowed smoothly into between the fins 57.

Further, in this present invention, the refrigerant steam 11 is condensed at the each stage of the liquid cooler 51, however it is not always condense all of the steam with holding it in each stage liquid cooler 51, the remainder is introduced toward the upper stage liquid cooler 51 and the condenser 5 being provided more upper portion than the liquid cooler 51, it is possible to work effectively the liquid stirring effect of the ascending steam bubbles 11 at all times over all region on which the chip 1 is mounted.

Further, since the above stated structure is adopted, the ascending steam bubbles 11 are not held and not stayed in the liquid cooler portion, even though the exothermic amount of the chip 1 increases and the generated steam bubbles 11 increase, accordingly the heat transfer performance toward the liquid cooler 51 is not lowered.

Further, both the power feeding system 50 and the substrate 40 are inserted into the chamber 52 in which the refrigerant liquid 3 is enclosed, even though the exothermic amount at the power feeding system 50 and the substrate 40 increases according to high integration of the semiconductor elements, it can be cooled then due to boiling of the refrigerant liquid 3.

Further, by taking out the sealing plate fixing frame 54 from the chamber 52, the power feeding system 50, the substrate 40 and the chips 1 are take out simultaneously, therefore it has an effect that maintenance is easily.

We claim:

1. A semiconductor cooling apparatus comprising:
   a container having enclosed a refrigerant liquid therein;
   a substrate having mounted a plurality of semiconductor elements thereon and dipped in said refrigerant liquid of said container;
   a condenser disposed at an upper portion of said container and condensing a generated refrigerant steam;
   a partition wall for separating a flow path of ascending refrigerant steam generated by cooling said semiconductor elements and a flow path of descending refrigerant liquid condensed by said condenser; and
   a plurality of guide flow paths, provided on said partition wall for sending said condensed refrigerant liquid from said flow path of descending refrigerant liquid to a semiconductor element side of said partition wall;
   wherein said guide flow paths are correspondingly positioned relative to said semiconductor elements to respectively supply condensed refrigerant liquid from said flow path of descending refrigerant liquid to each of said semiconductor elements.

2. A semiconductor cooling apparatus according to claim 1, wherein each guide flow path is constituted in a manner that a semiconductor element side thereof is to be at a higher position than an anti-semiconductor element side thereof.

3. In a semiconductor cooling apparatus wherein a substrate on which a plurality of semiconductor elements are mounted on and is dipped into a container having a refrigerant liquid enclosed therein, a heat of said semiconductor elements is absorbed by boiling of said refrigerant liquid and a resulting steam is condensed by a condenser disposed at an upper portion of said container and condensate is sent back to a lower portion of said container, wherein said semiconductor cooling apparatus further comprises:
   a heat transfer member for promoting boiling and being mounted on each semiconductor element;
   a partition wall for separating a steam flow path for guiding said steam to said condenser and a condensate flow path for guiding said condensate to a lower portion of said container; and
   a plurality of guide flow paths provided on said partition wall for sending said condensate from said condensate flow path to a semiconductor element side of said partition wall;
   wherein said guide flow paths are correspondingly positioned relative to said semiconductor elements to respectively supply condensate from said condensate flow path to each of said semiconductor elements.

4. A semiconductor cooling apparatus according to claim 3, wherein each guide flow path comprises a backflow prevention means for preventing a flow of refrigerant liquid from flowing from said semiconductor element side to said condensate flow path.

5. A semiconductor cooling apparatus according to claim 3, wherein an outlet at a tip of each guide flow path is positioned below each heat transfer member for promoting boiling.

6. A semiconductor cooling apparatus according to claim 4, wherein said back-flow prevention means is formed by shaping each guide flow path in a tubular form and extending said guide flow path obliquely upward towards said heat transfer member for promoting boiling.

7. A semiconductor cooling apparatus according to claim 4, wherein each back-flow prevention means comprises a guide plate formed to extend obliquely upward from a lower end of said guide flow path, which is formed either as an opening or a gap on said partition wall, towards said heat transfer member for promoting boiling of refrigerant liquid by said semiconductor elements.

8. A semiconductor cooling apparatus according to claim 4, wherein a flow rate increases progressively at a higher position of said guide flow path.

9. A semiconductor cooling apparatus according to claim 3, wherein said partition wall is disposed between said heat transfer member for promoting boiling and a wall opposite to, and in front of, said heat transfer member.

10. A semiconductor cooling apparatus according to claim 3, wherein said partition wall is disposed by a side of each of said heat transfer member for promoting boiling.

11. A heat generation member cooling apparatus comprising:
    a container having enclosed a refrigerant liquid therein;
    a heat generation member being dipped in said refrigerant liquid of said container;
    a heat transfer member for promoting boiling being attached to said heat generation member and having formed therein a number of penetrating holes in every direction;
    a condenser disposed at an upper portion of said container for condensing a generated refrigerant steam;
    a partition wall for partitioning a flow path of ascending a refrigerant steam generated by cooling said heat generation member and a flow path of descending refrigerant liquid condensed by said condenser; and
    a plurality of guide flow paths provided on said partition wall for sending condensed refrigerant liquid from said flow path of descending refrigerant liquid to a heat generation member side of said partition wall;
    wherein said guide flow paths are correspondingly positioned relative to said semiconductor elements to respectively supply condensed refrigerant liquid from said flow path of descending refrigerant liquid to said heat generation member.

12. A heat generation member cooling apparatus according to claim 11, wherein each guide flow path is constituted by a pipe provided on said partition wall.

13. A heat generation member cooling apparatus according to claim 12, wherein a tip of said pipe is to reach an inner portion of said heat transfer member for promoting boiling.

14. A semiconductor cooling apparatus comprising: a container having enclosed a refrigerant liquid therein;
a plurality of semiconductor elements mounted on a substrate and dipped in said refrigerant liquid of said container;
a condenser disposed on an upper portion of said container for condensing a generated refrigerant steam;
a partition means for partitioning a flow path of ascending refrigerant steam generated by cooling said semiconductor elements and a flow path of descending refrigerant liquid condensed by said condenser; and
a plurality of heat transfer members for promoting boiling each having a plurality of penetrating holes in every direction, wherein one end of each transfer member is mounted on a semiconductor element and the other end thereof extends through said partition wall to said flow path of descending refrigerant liquid for guiding condensed refrigerant liquid through a flow path within said heat transfer member to said semiconductor element upon which said heat transfer member is mounted.

15. A semiconductor cooling apparatus according to claim 14, wherein each heat transfer member is formed in such a manner that a size of each penetrating hole thereof is made smaller than that of said flow path within said heat transfer member.

16. In a semiconductor cooling apparatus wherein a plurality of heat generation members are mounted on a substrate, and said substrate is dipped and cooled in a refrigerant liquid being enclosed in a container, said apparatus comprising:
a plurality of liquid coolers and a condenser provided relative to said heat generation members;
wherein each liquid cooler is disposed at an up and down direction at a side of said container opposite to said substrate;
wherein said condenser is disposed at an upper portion of said container;
wherein a part of said refrigerant steam generated from each heat generation member is condensed by respective liquid cooler and a resulting condensed refrigerant liquid is introduced to said heat generation member from said liquid cooler;
wherein a refrigerant steam being not condensed by said liquid coolers is condensed by said condenser provided at said upper portion of said container;
a partition wall for partitioning a flow path of ascending refrigerant steam generated by cooling said heat generation member and a flow path of descending refrigerant liquid condensed by said condenser;
a plurality of guide flow paths provided on said partition wall for sending said condensed refrigerant liquid to a heat generation member side of said partition wall, wherein said guide flow paths correspond to said heat generation members, and wherein condensed refrigerant liquid from said flow path of descending refrigerant liquid separated by said partition wall is supplied to said heat generation members through corresponding guide flow paths.

17. A semiconductor cooling apparatus according to claim 16, wherein each liquid cooler comprises a pipe for flowing wherein refrigerant fluid and fine provided on a corresponding pipe and disposed at a vertical direction, and a cooling steam generated from said heat generation member passes between said fins.

18. A semiconductor cooling apparatus according to claim 17, wherein said fins on each liquid cooler are positioned to come near to said heat generation member at an upper portion side and to go away from said heat generation member at a lower portion side, and said fine are formed roughly at the upper portion side closing coming near said heat generation member and are formed densely at said lower portion side going way from said heat generation member.

19. A semiconductor cooling apparatus comprising:
a container having enclosed a refrigerant liquid therein;
a substrate having mounted a plurality of heat generation members thereon and dipped in said refrigerant liquid of said container;
a condenser provided on a refrigerant steam layer portion of an upper portion of said container;
a liquid cooler disposed relative to said heat generation members, said liquid cooler comprises a plurality of pipes, which are disposed at an up-and-down direction in said refrigerant liquid at a side of said container opposite to said substrate for passing a cooling fluid; and
a number of fins attached to said pipe;
wherein said fins of said liquid cooler are disposed in a vertical direction, an upper portion side of each fin is disposed to be close to a heat generation member, a lower portion side of each fin is disposed to go away from said heat generation member, each fin is constituted in such a manner that said fin is formed roughly at said upper portion side close to said heat generation member and is formed densely at said lower portion side going away from said heat generation member;
a partition wall for partitioning a flow path of ascending refrigerant steam generated by cooling said heat generation members and a flow path of descending a refrigerant liquid condensed by said condenser; and
a plurality of guide flow paths provided on said partition wall for sending said condensed refrigerant liquid to a heat generation member side of said partition wall, wherein each guide flow paths is correspondingly positioned relative to said heat generation members, and wherein a condensed refrigerant liquid from said descending flow path separated by said partition wall is supplied to each heat generation member through a flow paths.

20. A semiconductor cooling apparatus comprising:
a container having enclosed a refrigerant liquid therein;
a substrate having mounted a plurality of semiconductor chips thereon constituting a heat generation member, said heat generation member being dipped in said refrigerant liquid of said container;
a power feeding system dipped in said refrigerant liquid of said container for feeding electric power to said substrate and said semiconductor chips;

a condenser provided in a refrigerant steam layer portion of an upper portion of said container;

a liquid cooler disposed relative to said semiconductor chips, said liquid cooler comprises a plurality of pipes, which are disposed at an up-and-down direction in said refrigerant liquid at a side of said container opposite to said substrate for passing a cooling fluid;

a number of fins attached to each pipe;

said container having a sealing plate and a fixing frame for fixing said sealing plate;

wherein said power feeding system and said substrate are formed smaller than said sealing plate, and by removing said sealing plate from said container, said power feeding system and said substrate are taken out from said container outside;

a partition wall for partitioning a flow path of ascending refrigerant steam generated by cooling said semiconductor chips and a flow path of descending a refrigerant liquid condensed by said condenser;

a plurality of guide flow paths provided on said partition wall for sending condensed refrigerant liquid to a semiconductor chip side of said partition wall;

wherein said guide flow paths are correspondingly positioned relative to said semiconductor chips; and wherein condensed refrigerant liquid from said flow path of descending refrigerant liquid is supplied to each of said semiconductor chips through correspond guide flow paths.

21. A semiconductor cooling apparatus according to claim 20, wherein a porous structure type heat transfer member for promoting boiling is mounted on a rear surface of said semiconductor chip.

22. A semiconductor cooling apparatus according to claim 20, wherein each fin of said liquid cooler is disposed in a vertical direction;

an upper portion side of said fin is disposed to be close to a chip, a lower portion side of said fin is disposed to go away from said chip;

said fin is constituted in such a manner that said fin is formed roughly at said upper portion side close to said chip and are formed densely at said lower portion side going away from said chip.

* * * * *